United States Patent
Li et al.

(10) Patent No.: US 10,714,204 B1
(45) Date of Patent: Jul. 14, 2020

(54) SHIFT REGISTER UNIT, DRIVING METHOD THEREOF, GATE DRIVING CIRCUIT AND DISPLAY DEVICE

(71) Applicants: Chongqing BOE Optoelectronics Technology Co., Ltd., Chongqing (CN); BOE TECHNOLOGY GROUP CO., LTD., Beijing (CN)

(72) Inventors: Yunze Li, Beijing (CN); Ni Yang, Beijing (CN); Hengyi Xu, Beijing (CN); Jianfeng Liu, Beijing (CN); Qi Hu, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/553,210

(22) Filed: Aug. 28, 2019

(30) Foreign Application Priority Data

Jan. 31, 2019 (CN) .......................... 2019 1 0097574

(51) Int. Cl.
*G11C 19/28* (2006.01)
*G09G 3/20* (2006.01)
(Continued)

(52) U.S. Cl.
CPC ........... *G11C 19/28* (2013.01); *G09G 3/3655* (2013.01); *G11C 5/147* (2013.01)

(58) Field of Classification Search
CPC combination set(s) only.
See application file for complete search history.

(56) References Cited

U.S. PATENT DOCUMENTS 10,140,911 B2* 11/2018 Zhang .................... G11C 19/28
10,236,073 B2* 3/2019 Feng .................... G09G 3/3677
(Continued)

FOREIGN PATENT DOCUMENTS

CN 101533623 A 9/2009
CN 101777386 A 7/2010
(Continued)

OTHER PUBLICATIONS

First Office Action for Chinese Patent Application No. 20190097574.8 dated Jan. 15, 2020.

*Primary Examiner* — An T Luu
(74) *Attorney, Agent, or Firm* — Calfee, Halter & Griswold LLP

(57) ABSTRACT

A shift register unit including a first node control circuit, a second node control circuit, an energy-storing circuit, a first voltage pull circuit, a second voltage pull circuit, and an output circuit. The first node control circuit is configured to transfer a reset signal at a reset signal terminal to a first node in response to the reset signal at the reset signal terminal being active. The second node control circuit is configured to transfer an inactive voltage at a first voltage terminal to the first node in response to a potential at a second node being active. The output circuit is configured to transfer a clock signal at a clock signal terminal to a signal output terminal in response to the potential at the second node being active.

20 Claims, 10 Drawing Sheets

(51) Int. Cl.
    *G11C 5/14*     (2006.01)
    *G09G 3/36*     (2006.01)

(56) References Cited

U.S. PATENT DOCUMENTS

| | | | |
|---|---|---|---|
| 10,467,937 B2 * | 11/2019 | Dong | ................ G11C 19/184 |
| 2011/0228894 A1 | 9/2011 | Wang et al. | |
| 2017/0270892 A1 | 9/2017 | Wang | |

FOREIGN PATENT DOCUMENTS

| | | | |
|---|---|---|---|
| CN | 102956213 A | 3/2013 | |
| CN | 104361852 A | 2/2015 | |
| CN | 105118414 A | 12/2015 | |
| KR | 1020140024994 A | 3/2014 | |

\* cited by examiner

SHIFT REGISTER UNIT, DRIVING METHOD THEREOF, GATE DRIVING CIRCUIT AND DISPLAY DEVICE

CROSS-REFERENCE TO RELATED APPLICATIONS

The present application claims the priority of Chinese Patent Application No. 201910097574.8, filed with the Chinese Patent Office on Jan. 31, 2019, the entire disclosure of which is incorporated herein by reference.

TECHNICAL FIELD

The present disclosure relates to the field of display technologies, and in particular, to a shift register unit, a method of driving the shift register unit, a gate driving circuit, and a display device.

BACKGROUND

Gate-driver-on-array (GOA) is a technique of integrating a gate driving circuit on an array substrate of a display device to reduce a bezel area. The GOA circuit typically includes a plurality of cascaded shift register units, each of which outputs a respective gate scan signal.

GOA circuits utilizing two supply voltages (dual VDD) have been proposed. Such a GOA circuit typically includes a relatively large number (e.g., 16) of thin film transistors, limiting its application in products with a very narrow bezel. In addition, during the operation of the GOA circuit, it may be possible to form a path between a high supply voltage VDD and a low supply voltage VSS, resulting in additional power consumption.

SUMMARY

In accordance with some exemplary embodiments, a shift register unit is provided which comprises: a reset signal terminal, a first voltage terminal, a second voltage terminal, a third voltage terminal, a clock signal terminal, a signal input terminal, and a signal output terminal; a first node control circuit configured to transfer a reset signal at the reset signal terminal to a first node in response to the reset signal at the reset signal terminal being active; a second node control circuit configured to transfer an inactive voltage at the first voltage terminal to the first node in response to a potential at a second node being active; an energy-storing circuit configured to store a voltage across the first node and the first voltage terminal; a first voltage pull circuit configured to transfer the inactive voltage at the first voltage terminal to the second node and the signal output terminal in response to a first supply voltage signal at the second voltage terminal and a potential at the first node being active; a second voltage pull circuit configured to transfer the inactive voltage at the first voltage terminal to the second node and the signal output terminal in response to a second supply voltage signal at the third voltage terminal and the potential at the first node being active; and an output circuit configured to transfer a clock signal at the clock signal terminal to the signal output terminal in response to the potential at the second node being active.

In some exemplary embodiments, the shift register unit further comprises: an initialization signal terminal; and an initialization circuit configured to transfer an initialization signal at the initialization signal terminal to the first node in response to the initialization signal at the initialization signal terminal being active.

In some exemplary embodiments, the shift register unit further comprises: a first input circuit configured to transfer an input signal at the signal input terminal to the second node in response to the input signal at the signal input terminal being active; and a second input circuit configured to transfer the inactive voltage at the first voltage terminal to the second node in response to the reset signal at the reset signal terminal being active.

In some exemplary embodiments, the shift register unit further comprises a reset circuit configured to transfer the inactive voltage at the first voltage terminal to the signal output terminal in response to the reset signal at the reset signal terminal being active.

In some exemplary embodiments, the first node control circuit comprises a first transistor comprising a gate connected to the reset signal terminal, a first electrode connected to the reset signal terminal, and a second electrode connected to the first node.

In some exemplary embodiments, the second node control circuit comprises a second transistor comprising a gate connected to the second node, a first electrode connected to the first node, and a second electrode connected to the first voltage terminal.

In some exemplary embodiments, the energy-storing circuit comprises a first capacitor comprising a first terminal connected to the first node and a second terminal connected to the first voltage terminal.

In some exemplary embodiments, the first voltage pull circuit comprises: a third transistor comprising a gate connected to the second voltage terminal, a first electrode connected to the third node, and a second electrode connected to the first node; a fourth transistor comprising a gate connected to the third node, a first electrode connected to the second node, and a second electrode connected to the first voltage terminal; and a fifth transistor comprising a gate connected to the third node, a first electrode connected to the signal output terminal, and a second electrode connected to the first voltage terminal.

In some exemplary embodiments, the second voltage pull circuit comprises: a sixth transistor comprising a gate connected to the third voltage terminal, a first electrode connected to the first node, and a second electrode connected to the fourth node; a seventh transistor comprising a gate connected to the fourth node, a first electrode connected to the second node, and a second electrode connected to the first voltage terminal; and an eighth transistor comprising a gate connected to the fourth node, a first electrode connected to the signal output terminal, and a second electrode connected to the first voltage terminal.

In some exemplary embodiments, the output circuit comprises: a second capacitor comprising a first terminal connected to the second node and a second terminal connected to the signal output terminal; and a thirteenth transistor comprising a gate connected to the second node, a first electrode connected to the clock signal terminal, and a second electrode connected to the signal output terminal.

In some exemplary embodiments, the initialization circuit comprises a ninth transistor comprising a gate connected to the initialization signal terminal, a first electrode connected to the initialization signal terminal, and a second electrode connected to the first node.

In some exemplary embodiments, the initialization circuit comprises: a ninth transistor comprising a gate connected to the initialization signal terminal, a first electrode connected to the initialization signal terminal, a second electrode connected to the first node; and a tenth transistor comprising a gate connected to the initialization signal terminal, a first electrode connected to the second node, and a second electrode connected to the first voltage terminal.

In some exemplary embodiments, the first input circuit comprises an eleventh transistor comprising a gate connected to the signal input terminal, a first electrode connected to the signal input terminal, and a second electrode connected to the second node. The second input circuit comprises a twelfth transistor comprising a gate connected to the reset signal terminal, a first electrode connected to the second node, and a second electrode connected to the first voltage terminal.

In some exemplary embodiments, the reset circuit comprises a fourteenth transistor comprising a gate connected to the reset signal terminal, a first electrode connected to the signal output terminal, and a second electrode connected to the first voltage terminal.

In accordance with some exemplary embodiments, a gate driving circuit is provided which comprises n shift register units as described above that are cascaded, n being an integer greater than or equal to 2. The signal input terminal of a first one of the n shift register units is configured to receive a start signal. The signal output terminal of an i-th one of the n shift register units is connected to the signal input terminal of an (i+1)-th one of the n shift register units, i being an integer, $1 \le i \le n-1$. The signal output terminal of the (i+1)-th one of the n shift register units is connected to the reset signal terminal of the i-th one of the n shift register units. The reset signal terminal of an n-th one of the n shift register units is configured to receive the start signal.

In accordance with some exemplary embodiments, a display device is provided which comprises the gate driving circuit as described above.

In accordance with some exemplary embodiments, a method of driving a shift register unit is provided. The shift register unit comprises: a reset signal terminal, a first voltage terminal, a second voltage terminal, a third voltage terminal, a clock signal terminal, a signal input terminal, and a signal output terminal; a first node control circuit configured to transfer a reset signal at the reset signal terminal to a first node in response to the reset signal at the reset signal terminal being active; a second node control circuit configured to transfer an inactive voltage at the first voltage terminal to the first node in response to a potential at a second node being active; an energy-storing circuit configured to store a voltage across the first node and the first voltage terminal; a first voltage pull circuit configured to transfer the inactive voltage at the first voltage terminal to the second node and the signal output terminal in response to a first supply voltage signal at the second voltage terminal and a potential at the first node being active; a second voltage pull circuit configured to transfer the inactive voltage at the first voltage terminal to the second node and the signal output terminal in response to a second supply voltage signal at the third voltage terminal and the potential at the first node being active; and an output circuit configured to transfer a clock signal at the clock signal terminal to the signal output terminal in response to the potential at the second node being active. The method comprises: responsive to the potential at the second node being active, transferring by the output circuit the clock signal at the clock signal terminal to the signal output terminal, and transferring by the second node control circuit the inactive voltage at the first voltage terminal to the first node; responsive to the reset signal at the reset signal terminal being active, transferring by the first node control circuit the reset signal at the reset signal terminal to the first node; and responsive to the potential at the first node being active, transferring the inactive voltage at the first voltage terminal to the second node and the signal output terminal.

In some exemplary embodiments, the first supply voltage signal at the second voltage terminal is active. The transferring the inactive voltage at the first voltage terminal to the second node and the signal output terminal comprises: responsive to the first supply voltage signal at the second voltage terminal and the potential at the first node being active, transferring by the first voltage pull circuit the inactive voltage at the first voltage terminal to the second node and the signal output terminal.

In some exemplary embodiments, the second supply voltage signal at the third voltage terminal is active. The transferring the inactive voltage at the first voltage terminal to the second node and the signal output terminal comprises: responsive to the second supply voltage signal at the third voltage terminal and the potential at the first node being active, transferring by the second voltage pull circuit the inactive voltage at the first voltage terminal to the second node and the signal output terminal.

In some exemplary embodiments, the shift register unit further comprises an initialization signal terminal and an initialization circuit, the initialization circuit being configured to transfer an initialization signal at the initialization signal terminal to the first node in response to the initialization signal at the initialization signal terminal being active. The method further comprises: responsive to the initialization signal at the initialization signal terminal being active, transferring by the initialization circuit the initialization signal at the initialization signal terminal to the first node.

BRIEF DESCRIPTION OF THE DRAWINGS

Further details, features and advantages of the present disclosure are disclosed in the following description of exemplary embodiments in conjunction with the accompanying drawings in which.

DETAILED DESCRIPTION

Figure 1:
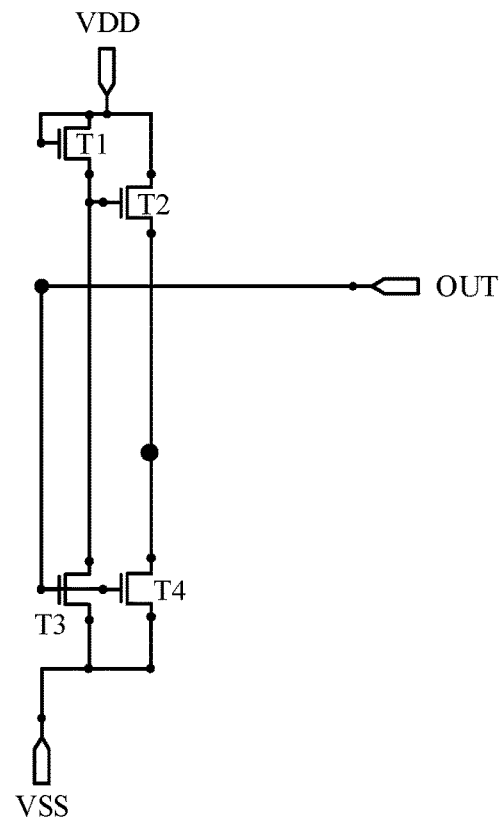
FIG. 1 is a schematic circuit diagram of a portion of a shift register unit in the related art.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a schematic circuit diagram of a portion of a shift register unit in the related art. As shown in FIG. 1, the shift register unit comprises first to fourth thin film transistors T1 to T4, and other elements are not shown for the sake of clarity. In the operation of the shift register unit, it is possible that the third thin film transistor T3 and the first thin film transistor T1 are simultaneously turned on, thereby forming a path between the supply voltages VDD and VSS. This results in undesired additional power consumption.

Figure 2:
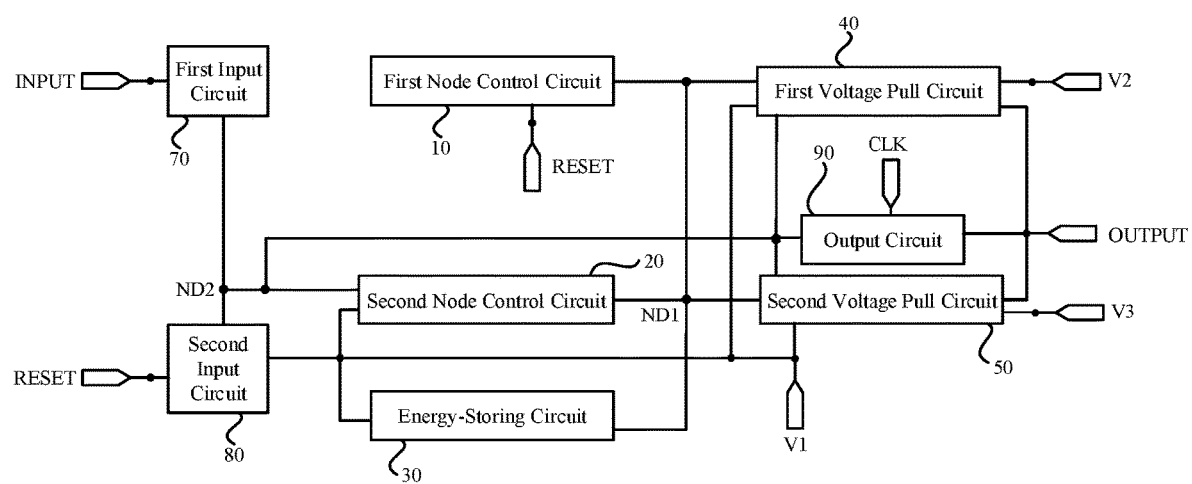
FIG. 2 is a schematic block diagram of a shift register unit in accordance with an exemplary embodiment.

FIG. 2 is a schematic block diagram of a shift register unit in accordance with an exemplary embodiment. As shown in FIG. 2, the shift register unit comprises a first node control circuit 10, a second node control circuit 20, an energy-storing circuit 30, a first voltage pull circuit 40, a second voltage pull circuit 50, and an output circuit 90.

The first node control circuit 10 is configured to transfer a reset signal at a reset signal terminal RESET to a first node ND1 in response to the reset signal at the reset signal terminal RESET being active.

The second node control circuit 20 is configured to transfer an inactive voltage at a first voltage terminal V1 to the first node ND1 in response to a potential at a second node ND2 being active.

The energy-storing circuit 30 is configured to store a voltage across the first node ND1 and the first voltage terminal V1.

The first voltage pull circuit 40 is configured to transfer the inactive voltage at the first voltage terminal V1 to the second node ND2 and a signal output terminal OUTPUT in response to a first supply voltage signal at a second voltage terminal V2 and a potential at the first node ND1 being active.

The second voltage pull circuit 50 is configured to the inactive voltage at the first voltage terminal V1 to the second node ND2 and the signal output terminal OUTPUT in response to a second supply voltage signal at a third voltage terminal V3 and the potential at the first node ND1 being active.

The output circuit 90 is configured to transfer a clock signal at a clock signal terminal CLK to the signal output terminal OUTPUT in response to the potential at the second node ND2 being active.

The phrase "signal being active" or "potential being active" as used herein means that the signal or potential has such a level that the circuit elements involved (e.g., transistors) are enabled. Similarly, the phrase "signal being inactive" or "potential being inactive" as used herein means that the signal or potential has such a level that the circuit elements involved are disabled. For N-type transistors, the gate-on voltage is high active. For P-type transistors, the gate-on voltage is low active. It will be understood that high or low is not intended to refer to a specific level, but may comprise a range of levels. Additionally, the terms "level" and "potential" are intended to be used interchangeably.

Typically, the first supply voltage signal at the second voltage terminal V2 and the second supply voltage signal at the third voltage terminal V3 are alternately active such that the first voltage pull circuit 40 and the second voltage pull circuit 50 operate alternately. For example, when the first supply voltage signal at the second voltage terminal V2 is active, the first node control circuit 10 operates, and when the second supply voltage signal at the third voltage terminal V3 is active, the second voltage pull circuit 50 operates.

It will be more apparent from the following that the shift register unit of FIG. 2 requires a relatively small number of transistors and that there is no path between the high supply voltage and the low supply voltage in its operation. Therefore, undesired additional power consumption is not produced as in the circuit of FIG. 1.

In some exemplary embodiments, the shift register unit further comprises a first input circuit 70 and a second input circuit 80.

The first input circuit 70 is configured to transfer an input signal at a signal input terminal INPUT to the second node ND2 in response to the input signal at the signal input terminal INPUT being active.

The second input circuit 80 is configured to transfer the inactive voltage at the first voltage terminal V1 to the second node ND2 in response to the reset signal at the reset signal terminal RESET being active.

Figure 3:
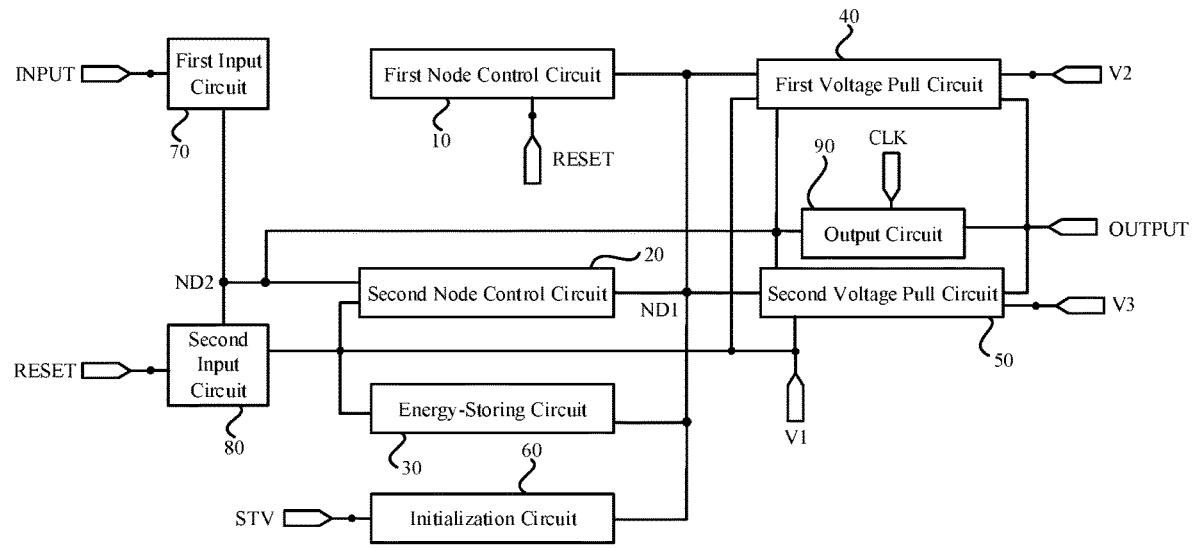
FIG. 3 is a schematic block diagram of a shift register unit in accordance with another exemplary embodiment.

FIG. 3 is a schematic block diagram of a shift register unit in accordance with another exemplary embodiment. The same elements as those in FIG. 2 are denoted by the same reference signs and will not be described in detail herein.

As shown in FIG. 3, the shift register unit further comprises an initialization circuit 60. The initialization circuit 60 is configured to transfer an initialization signal at an initialization signal terminal STV to the first node ND1 in response to the initialization signal at the initialization signal terminal STV being active. As will be further described below, the initialization circuit 60 is used to initialize the potential at the first node ND1 in the shift register unit during an initialization phase, thereby improving the robustness of the shift register unit.

Figure 4:
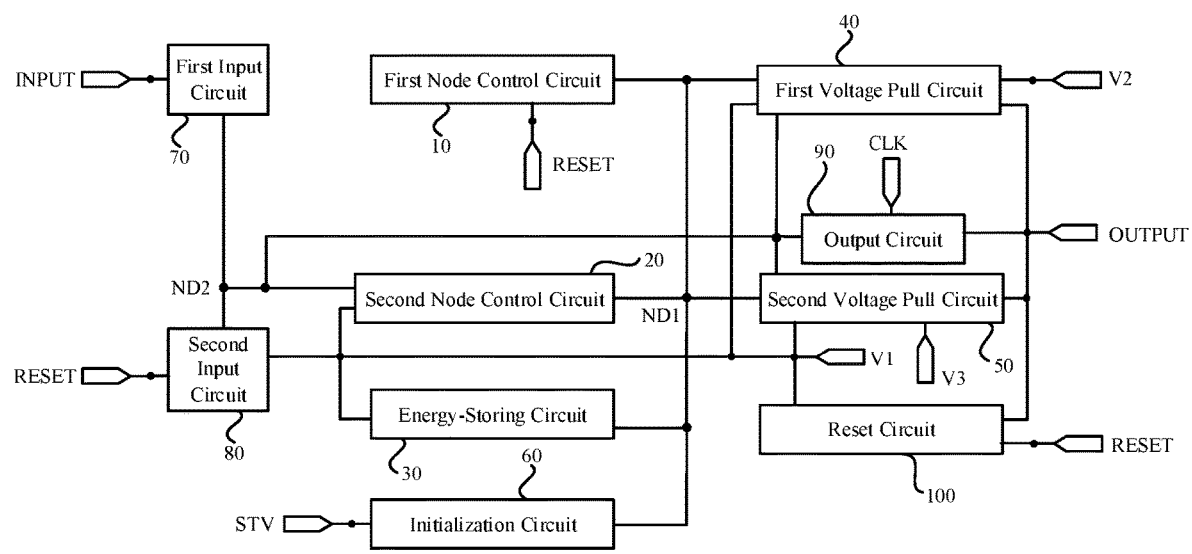
FIG. 4 is a schematic block diagram of a shift register unit in accordance with another exemplary embodiment.

FIG. 4 is a schematic block diagram of a shift register unit in accordance with another embodiment of the present disclosure. The same elements as those in FIG. 3 are denoted by the same reference signs and will not be described in detail herein.

As shown in FIG. 4, the shift register unit further comprises a reset circuit 100. The reset circuit 100 is configured to transfer the inactive voltage at the first voltage terminal V1 to the signal output terminal OUTPUT in response to the reset signal at the reset signal terminal RESET being active. As will be further described below, the reset circuit 100 is used to reset the potential at the signal output terminal OUTPUT, thereby further improving the robustness of the shift register unit.

Figure 5:
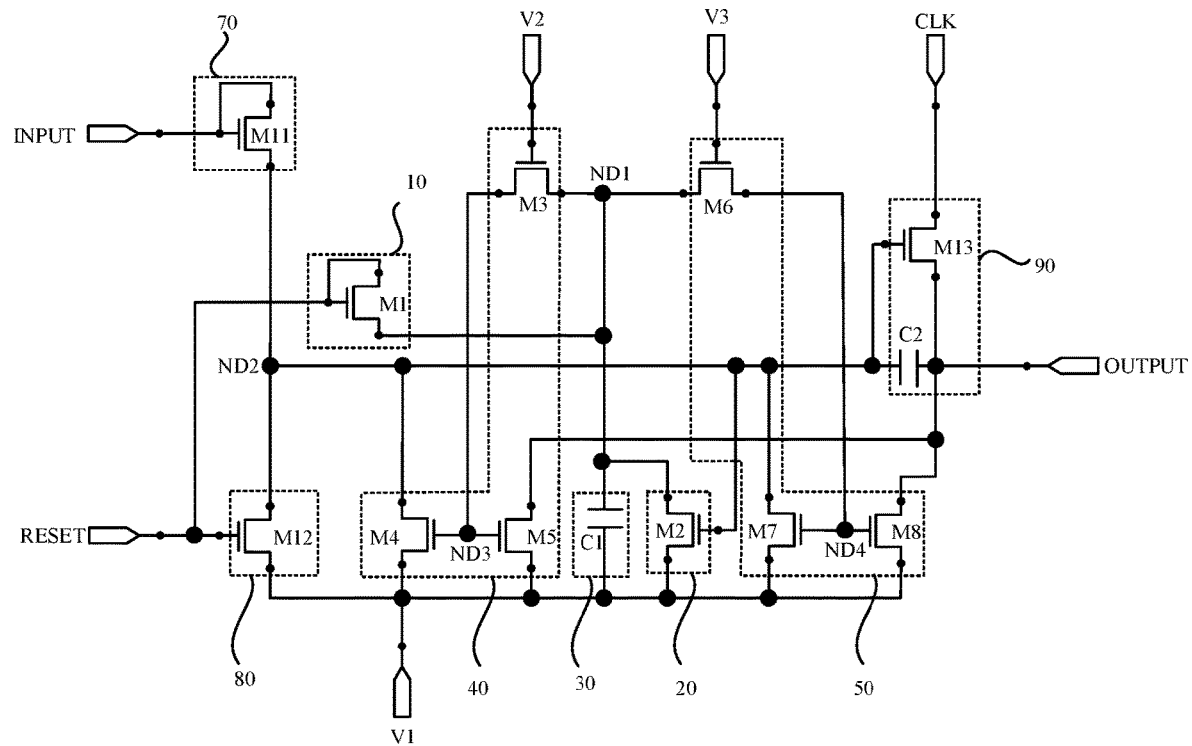
FIG. 5 is a schematic circuit diagram showing an example of the shift register unit shown in FIG. 2.

FIG. 5 is a schematic circuit diagram showing an example of the shift register unit shown in FIG. 2. The shift register unit shown in FIG. 2 will be described in detail below with reference to FIG. 5.

The first node control circuit 10 comprises a first transistor M1. The first transistor M1 comprises a gate connected to the reset signal terminal RESET, a first electrode connected to the reset signal terminal RESET, and a second electrode connected to the first node ND1.

The second node control circuit 20 comprises a second transistor M2. The second transistor M2 comprises a gate connected to the second node ND2, a first electrode connected to the first node ND1, and a second electrode connected to the first voltage terminal V1.

The energy-storing circuit 30 comprises a first capacitor C1. The first capacitor C1 comprises a first terminal connected to the first node ND1 and a second terminal connected to the first voltage terminal V1.

The first voltage pull circuit 40 comprises a third transistor M3, a fourth transistor M4, and a fifth transistor M5. The third transistor M3 comprises a gate connected to the second voltage terminal V2, a first electrode connected to the third node ND3, and a second electrode connected to the first node ND1. The fourth transistor M4 comprises a gate connected to the third node ND3, a first electrode connected to the second node ND2, and a second electrode connected to the first voltage terminal V1. The fifth transistor M5 comprises a gate connected to the third node ND3, a first electrode connected to the signal output terminal OUTPUT, and a second electrode connected to the first voltage terminal V1.

The second voltage pull circuit 50 comprises a sixth transistor M6, a seventh transistor M7, and an eighth transistor M8. The sixth transistor M6 comprises a gate connected to the third voltage terminal V3, a first electrode connected to the first node ND1, and a second electrode connected to the fourth node ND4. The seventh transistor M7 comprises a gate connected to the fourth node ND4, a first electrode connected to the second node ND2, and a second electrode connected to the first voltage terminal V1. The eighth transistor M8 comprises a gate connected to the fourth node ND4, a first electrode connected to the signal output terminal OUTPUT, and a second electrode connected to the first voltage terminal V1.

The first input circuit 70 comprises an eleventh transistor M11. The eleventh transistor M11 comprises a gate connected to the signal input terminal INPUT, a first electrode connected to the signal input terminal INPUT, and a second electrode connected to the second node ND2.

The second input circuit 80 comprises a twelfth transistor M12. The twelfth transistor M12 comprises a gate connected to the reset signal terminal RESET, a first electrode connected to the second node ND2, and a second electrode connected to the first voltage terminal V1.

The output circuit 90 comprises a second capacitor C2 and a thirteenth transistor M13. The second capacitor C2 comprises a first terminal connected to the second node ND2 and a second terminal connected to the signal output terminal OUTPUT. The thirteenth transistor M13 comprises a gate connected to the second node ND2, a first electrode connected to the clock signal terminal CLK, and a second electrode connected to the signal output terminal OUTPUT.

When the second node ND2 is at a high potential, the second transistor M2 is turned on, and the low-level voltage at the first voltage terminal V1 is transferred to the first node ND1. The sixth transistor M6 is turned off and the third transistor M3 is turned on (assuming that the second voltage terminal V2 is at a high potential and the third voltage terminal V3 is at a low potential), so that the low-level voltage at the first node ND1 is transferred to the third node ND3 through the third transistor M3. Thus, the fourth transistor M4 and the fifth transistor M5 are turned off, ensuring that the high potential at the second node ND2 is not affected. Compared with the conventional design, the competition relationship between the second node ND2 and the pull-down node ND3 or ND4 is effectively avoided. That is, there is no problem that the potential at the pull-down node ND3 or ND4 cannot be pulled down due to a slow charging of the second node ND2, or the charging of the second node ND2 is affected due to slow decrease in the potential at the pull-down node ND3 or ND4.

In addition, there is no path between the high supply voltage V2 or V3 and the low supply voltage V1, avoiding the extra power consumed by the shift register unit.

Figure 6:
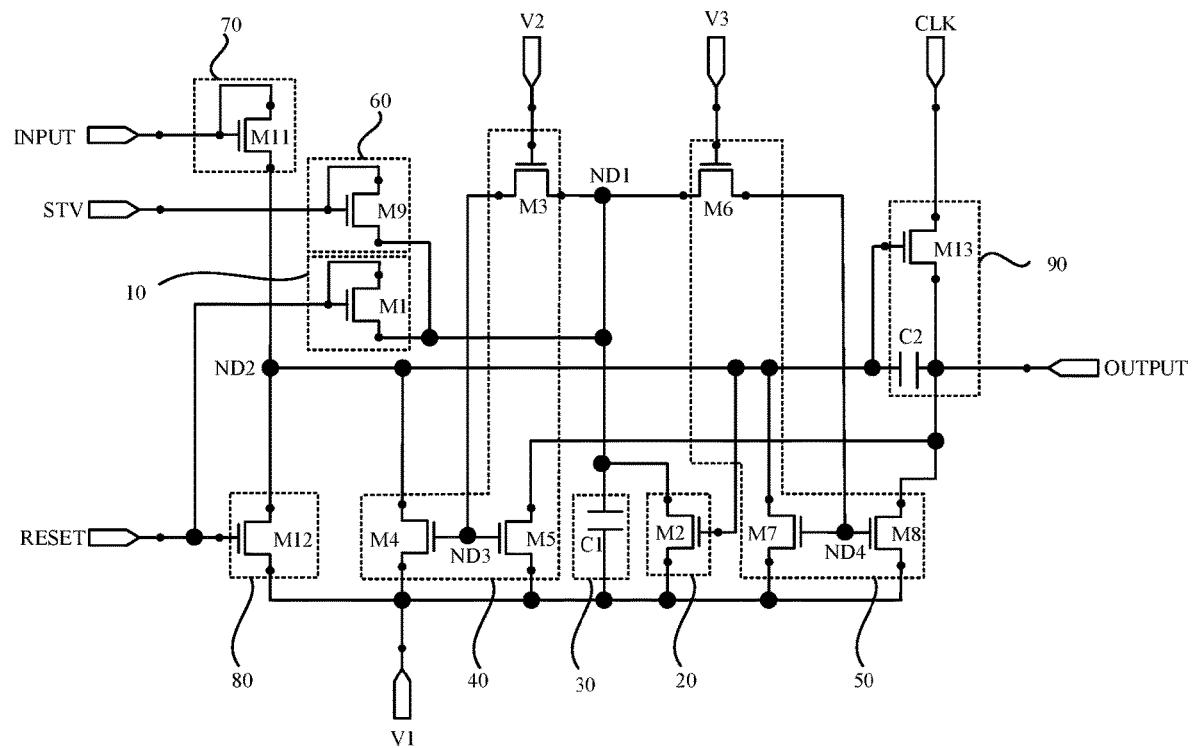
FIG. 6 is a schematic circuit diagram showing an example of the shift register unit shown in FIG. 3.

FIG. 6 is a schematic circuit diagram showing an example of the shift register unit shown in FIG. 3. The same elements as those in FIG. 5 are denoted by the same reference signs and will not be described in detail herein.

The initialization circuit 60 comprises a ninth transistor M9. The ninth transistor M9 comprises a gate connected to the initialization signal terminal STV, a first electrode connected to the initialization signal terminal STV, and a second electrode connected to the first node ND1.

Figure 7:
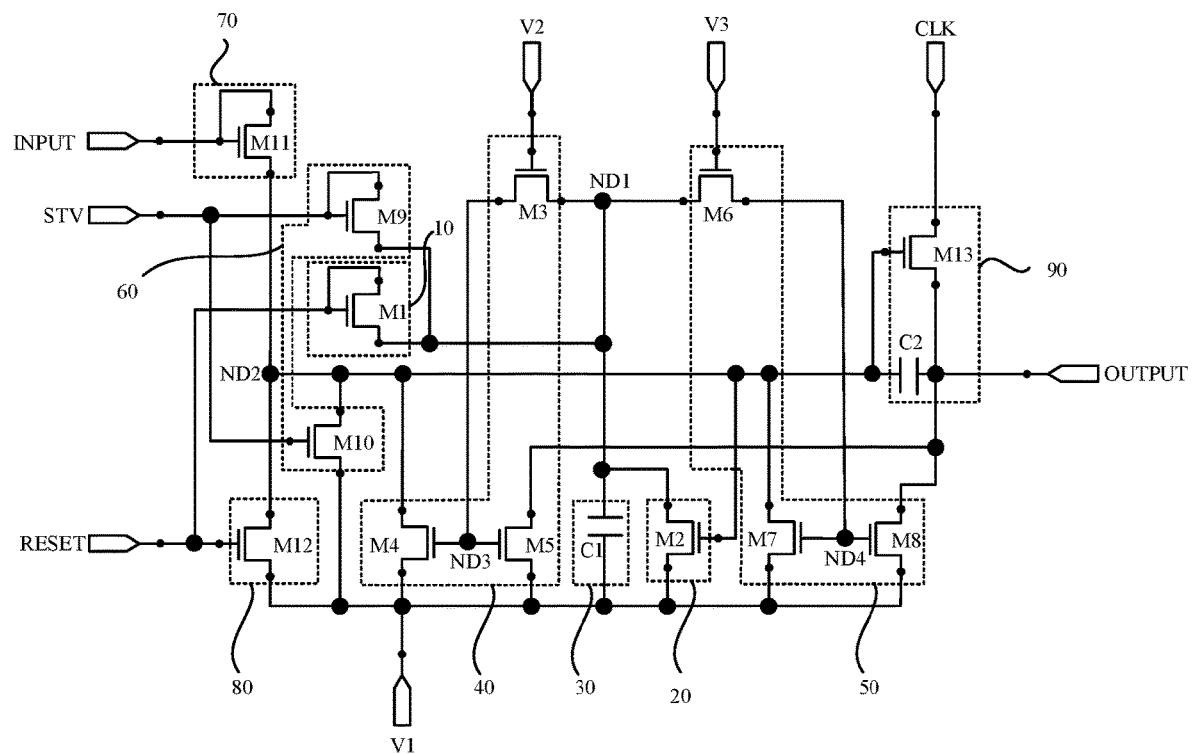
FIG. 7 is a schematic circuit diagram showing another example of the shift register unit shown in FIG. 3.

FIG. 7 is a schematic circuit diagram showing another example of the shift register unit shown in FIG. 3. The same elements as those in FIG. 6 are denoted by the same reference signs and will not be described in detail herein.

The initialization circuit 60 further comprises, in addition to the ninth transistor M9, a tenth transistor M10. The tenth transistor M10 comprises a gate connected to the initialization signal terminal STV, a first electrode connected to the second node ND2, and a second electrode connected to the first voltage terminal V1. The tenth transistor M10 is used to initialize the potential at the second node ND2 in the initialization phase, further improving the robustness of the shift register unit.

Figure 8:
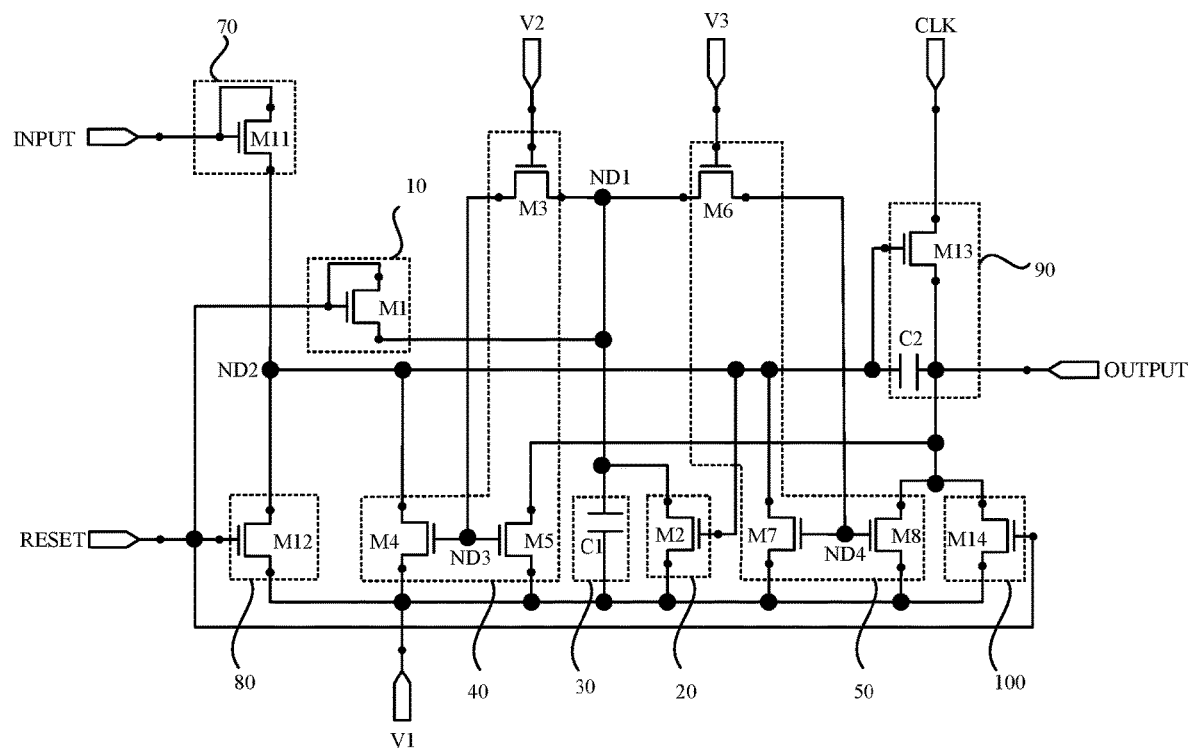
FIG. 8 is a schematic circuit diagram showing an example of a shift register unit in accordance with an exemplary embodiment.

FIG. 8 is a schematic circuit diagram showing an example of a shift register unit in accordance with an embodiment of the present disclosure. As shown in FIG. 8, the shift register unit does not comprise the initialization circuit 60 shown in FIG. 7, but comprises the reset circuit 100.

The reset circuit 100 comprises a fourteenth transistor M14. The fourteenth transistor M14 comprises a gate connected to the reset signal terminal RESET, a first electrode connected to the signal output terminal OUTPUT, and a second electrode connected to the first voltage terminal V1. The reset circuit 100 is used to reset the potential at the signal output terminal OUTPUT, further improving the robustness of the shift register unit.

Figure 9:
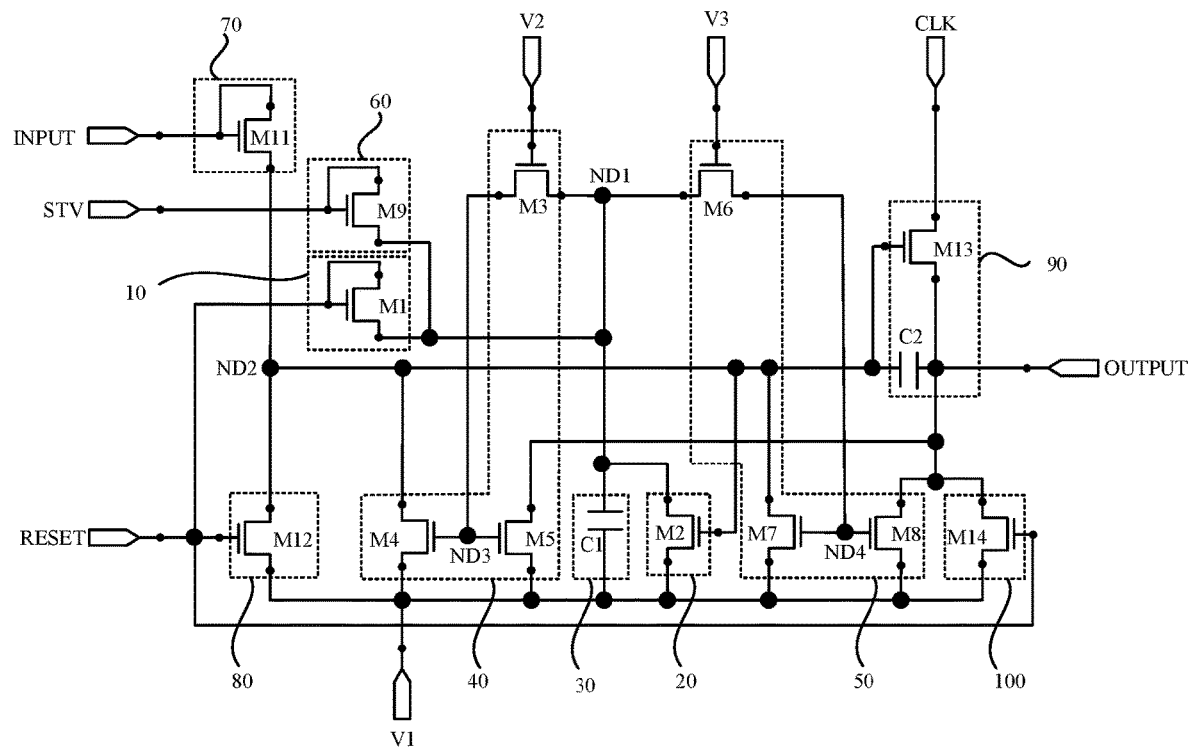
FIG. 9 is a schematic circuit diagram showing an example of the shift register unit shown in FIG. 4.

FIG. 9 is a schematic circuit diagram showing an example of the shift register unit shown in FIG. 4. The same elements as those in FIGS. 6 and 8 are denoted by the same reference signs and will not be described in detail herein.

Compared to the example shift register units of FIGS. 6 and 8, the shift register unit of FIG. 9 comprises both the initialization circuit 60 and the reset circuit 100, with the initialization circuit 60 comprising the ninth transistor M9, and the reset circuit 100 comprising the fourteenth transistor M14. This makes it possible for such a shift register unit to not only initialize the potential at the first node ND1 in the initialization phase but also reset the potential at the signal output terminal OUTPUT. Therefore, the robustness of the shift register unit is improved.

Figure 10:
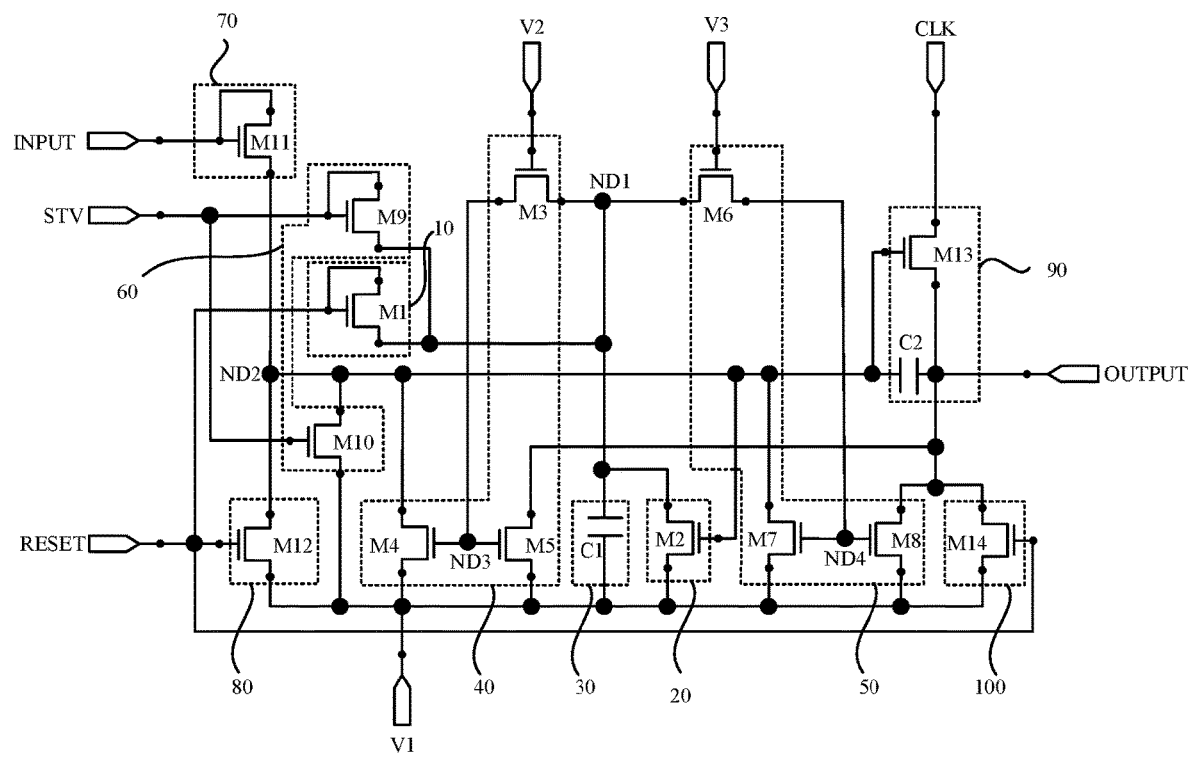
FIG. 10 is schematic circuit diagram showing another example of the shift register unit shown in FIG. 4.

FIG. 10 is a schematic circuit diagram showing another example of the shift register unit shown in FIG. 4. The same elements as those in FIGS. 7 and 8 are denoted by the same reference signs and will not be described in detail herein.

Compared to the example shift register units of FIGS. 7 and 8, the shift register unit of FIG. 9 comprises both the initialization circuit 60 and the reset circuit 100, with the initialization circuit 60 comprising the ninth transistor M9 and a tenth transistor M10, and the reset circuit 100 comprising a fourteenth transistor M14. This makes it possible for such a shift register unit to not only initialize the potentials at the first and second nodes ND1 and ND2 in the initialization phase but also reset the potential at the signal output terminal OUTPUT. Therefore, the robustness of the shift register unit is improved.

In the shift register unit embodiments described above, only a smaller number of transistors are required compared to conventional designs, which is advantageous in reducing the footprint of the shift register unit. Although the first capacitor C1 is added, the first capacitor C1 can be realized by way of wiring without occupying extra space. Therefore, this facilitates the application of the shift register unit and the resulting gate driving circuit in narrow bezel products.

Although the transistors are illustrated and described in the above embodiments as N-type transistors, P-type transistors are possible. In the case of a P-type transistor, the gate-on voltage has a low-level, and the gate-off voltage has a high level. The transistors may, for example, take the form of thin film transistors, which are typically fabricated such that their first and second electrodes are used interchangeably. Other embodiments are also contemplated.

Figure 11:
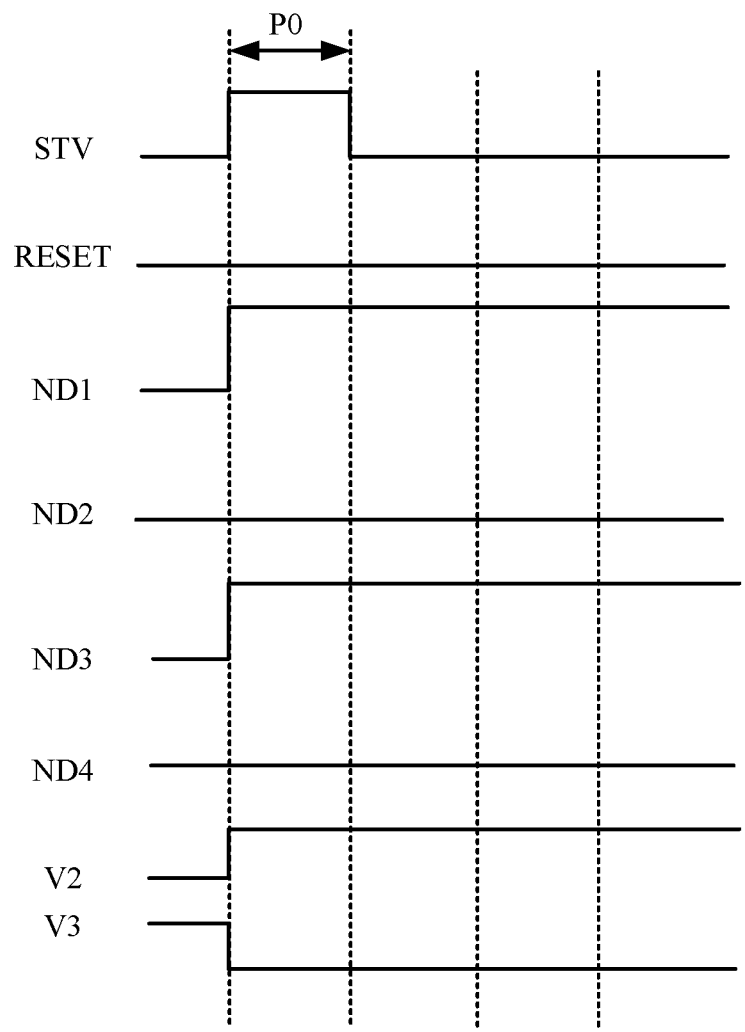
FIG. 11 is a timing diagram of the shift register unit shown in FIG. 10 in an initialization phase.
Figure 12:
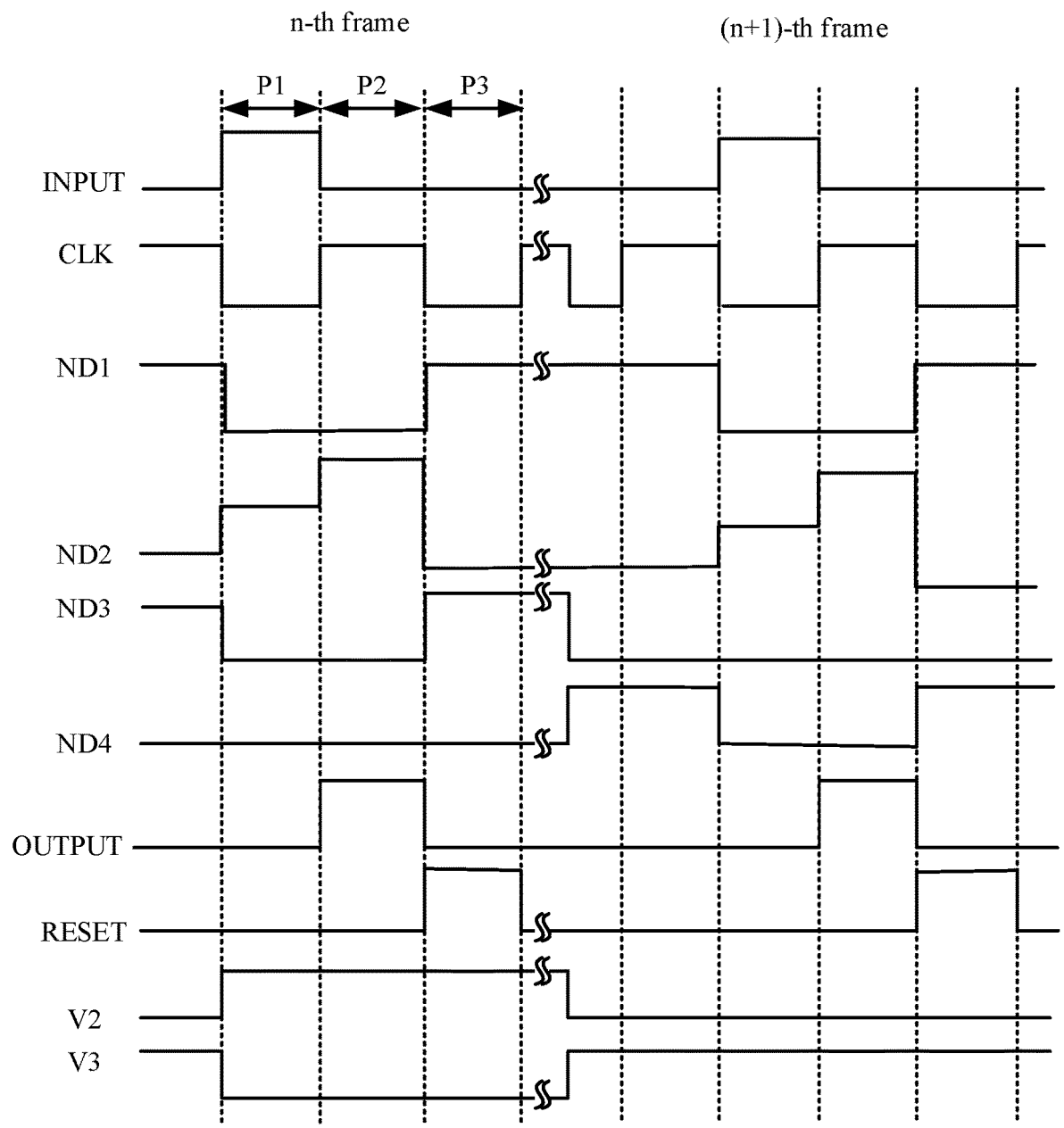
FIG. 12 is a timing diagram of the shift register unit shown in FIG. 10 in different phases of operation.

FIG. 11 is a timing diagram of the shift register unit shown in FIG. 10 in an initialization phase, and FIG. 12 is a timing diagram of the shift register unit shown in FIG. 10 in different phases of operation. Hereinafter, the operation of the shift register unit shown in FIG. 10 will be illustrated in detail in conjunction with FIGS. 11 and 12.

In the initialization phase P0, STV=1, RESET=0, where "0" represents a low-level and "1" represents a high level. In addition, it is assumed that V2=1 and V3=0.

Under the control of the high-level start signal at the initialization signal terminal STV, the ninth transistor M9 is turned on, and the high-level start signal at the initialization signal terminal STV is transferred to the first node ND1 and the first capacitor C1. The first capacitor C1 is charged by the high-level start signal, and during this phase, the first capacitor C1 is capable of maintaining the first node ND1 at a high potential. The tenth transistor M10 is also turned on, and the low-level voltage at the first voltage terminal V1 is transferred to the second node ND2 to initialize the second node ND2.

Under the control of the high-level signal at the second voltage terminal V2, the third transistor M3 is turned on. Under the control of the low-level signal at the third voltage terminal V3, the sixth transistor M6 is turned off. In this case, the first voltage pull circuit 40 operates and the second voltage pull circuit 50 does not operate. The high-level signal at the first node ND1 is transferred to the third node ND3 through the third transistor M3. Under the control of the high-level signal at the third node ND3, the fourth transistor M4 is turned on, and the low-level voltage at the first voltage terminal V1 is transferred to the second node ND2 to initialize the second node ND2. The fifth transistor M5 is also turned on, and the low-level voltage at the first voltage terminal V1 is transferred to the signal output terminal OUTPUT to initialize the signal output terminal OUTPUT.

Referring now to FIG. 12, in the first phase P1, INPUT=1, STV=0, RESET=0, CLK=0.

Under the control of the high-level signal at the signal input terminal INPUT, the eleventh transistor M11 is turned on, and the high-level signal at the signal input terminal INPUT is transferred to the second node ND2. The second capacitor C2 is charged with the high-level signal and the second node ND2 is set to be at a high potential. Under the control of the high potential at the second node ND2, the thirteenth transistor M13 is turned on, and the low-level signal at the clock signal terminal CLK is transferred to the signal output terminal OUTPUT. At the same time, under the control of the high level at the second node ND2, the second transistor M2 is turned on, and the low-level voltage at the first voltage terminal V1 is transferred to the first node ND1 and the first capacitor C1. The first node ND1 is set to be at a low potential.

Under the control of the high-level voltage at the second voltage terminal V2, the third transistor M3 is turned on. Under the control of the low-level voltage at the third voltage terminal V3, the sixth transistor M6 is turned off. The low potential at the first node ND1 is transferred to the third node ND3 through the third transistor M3, so that the third node ND3 is set to be at a low potential. Under the control of the low potential at the third node ND3, the fourth transistor M4 and the fifth transistor M5 are turned off.

In the second phase P2, INPUT=0, STV=0, RESET=0, CLK=1.

Under the control of the low-level signal at the signal input terminal INPUT, the eleventh transistor M11 is turned off. The second capacitor C2 maintains the second node ND2 at a high potential, so that the thirteenth transistor M13 remains on. In this case, the high-level signal at the clock signal terminal CLK is transferred to the signal output terminal OUTPUT through the thirteenth transistor M13. Due to a self-boosting effect of the second capacitor C2, the potential at the second node ND2 is further raised, ensuring that the thirteenth transistor M13 is in an on state. The high-level signal at the clock signal terminal CLK is output as a gate scan signal to a gate line connected to the signal output terminal OUTPUT.

Under the control of the high potential at the second node ND2, the second transistor M2 is turned on, and the low-level voltage at the first voltage terminal V1 is transferred to the first node ND1 and the first capacitor C1, so that the first node ND1 is still at the low potential.

Under the control of the high-level voltage at the second voltage terminal V2, the third transistor M3 is turned on. Under the control of the low-level voltage at the third voltage terminal V3, the sixth transistor M6 is turned off. The low potential at the first node ND1 is transferred to the third node ND3 through the third transistor M3 such that the third node ND3 is still at the low potential. Under the control of the low potential at the third node ND3, the fourth transistor M4 and the fifth transistor M5 are turned off.

In the third phase P3, INPUT=0, STV=0, RESET=1, CLK=0.

Under the control of the high-level signal at the reset signal terminal RESET, the twelfth transistor M12 is turned on, and the low-level voltage at the first voltage terminal V1 is transferred to the second node ND2. The potential at the second node ND2 is pulled down. The fourteenth transistor M14 is also turned on, and the low-level voltage at the first voltage terminal V1 is transferred to the signal output terminal OUTPUT. The first transistor M1 is also turned on, and the high-level signal at the reset signal terminal RESET is transferred to the first node ND1 and the first capacitor C1. The first capacitor C1 is charged by the high-level signal at the reset signal terminal RESET.

Under the control of the high-level signal at the second voltage terminal V2, the third transistor M3 is turned on. Under the control of the low-level signal at the third voltage terminal V3, the sixth transistor M6 is turned off. The high potential at the first node ND1 is transferred to the third node ND3 through the third transistor M3 such that the third node ND3 is at a high potential. Under the control of the high potential at the third node ND3, the fourth transistor M4 is turned on, and the low-level voltage at the first voltage terminal V1 is transferred to the second node ND2, thereby de-noising the second node ND2. Under the control of the high potential at the third node ND3, the fifth transistor M5 is also turned on, and the low-level voltage at the first voltage terminal V1 is transferred to the signal output terminal OUTPUT, thereby de-noising the signal output terminal OUTPUT.

Thereafter, the first capacitor C1 maintains the first node ND1 at a high potential. The high potential at the first node ND1 is transferred to the third node ND3 through the third transistor M3, so that the fourth transistor M4 and the fifth transistor M5 are turned on. The fourth transistor M4 transfers the low-level voltage at the first voltage terminal V1 to the second node ND2, and continuously reduces noise at the second node ND2. The fifth transistor M5 transfers the low-level voltage at the first voltage terminal V1 to the signal output terminal OUTPUT, and continuously reduces the noise at the signal output terminal OUTPUT.

In the scan period of the next frame, V2=0 and V3=1. That is, the first voltage pull circuit 40 does not operate and the second voltage pull circuit 50 operates. For the sake of brevity, the operation of the shift register unit of FIG. 10 in the scan period of the next frame will not be described here.

Figure 13:
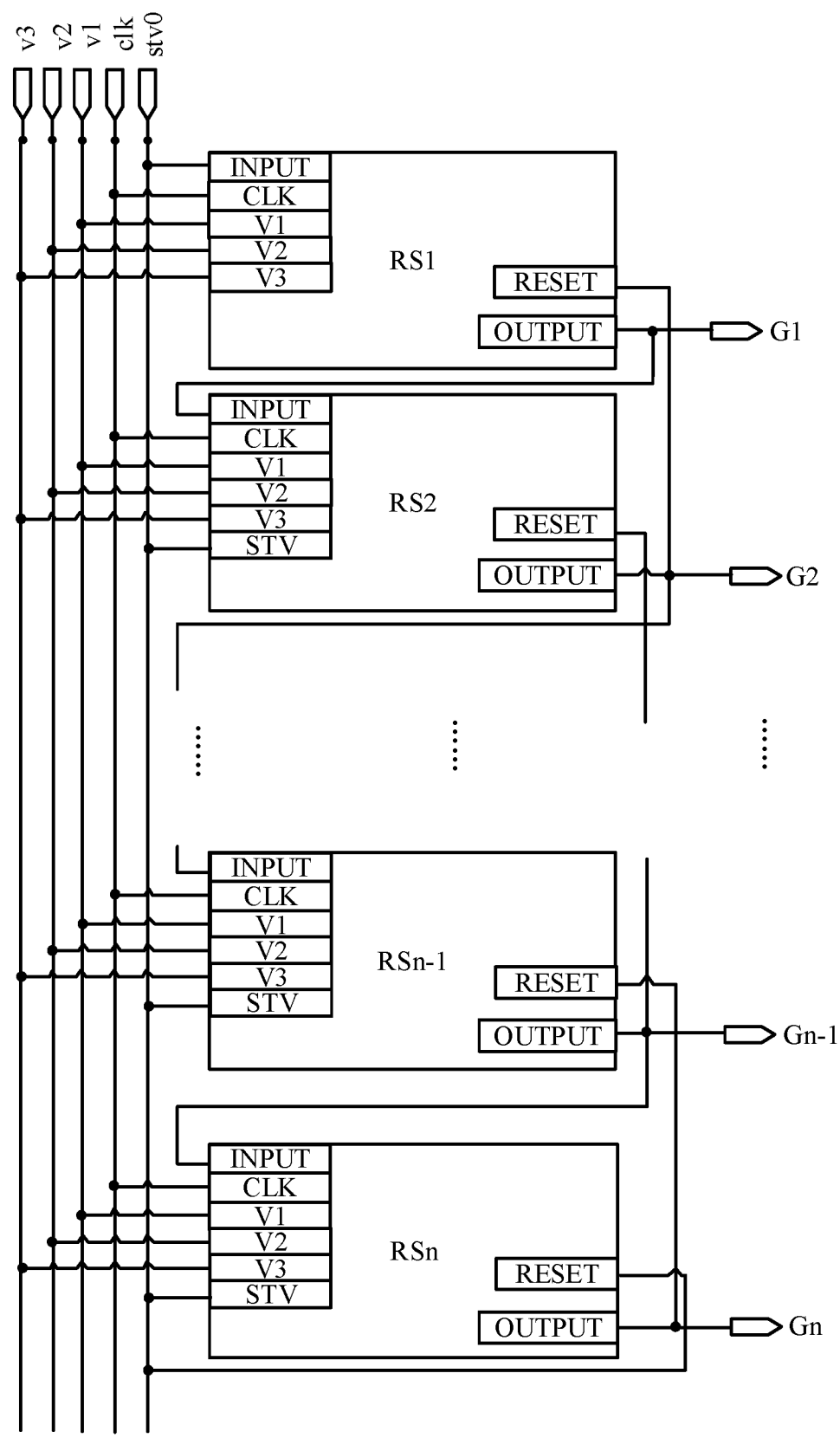
FIG. 13 is a schematic block diagram of a gate driving circuit in accordance with an exemplary embodiment.

FIG. 13 is a schematic block diagram of a gate driving circuit in accordance with an exemplary embodiment. As shown in FIG. 13, the gate driving circuit comprises n cascaded shift register units RS1, RS2, . . . , RSn-1, and RSn (n is an integer greater than or equal to 2).

The signal input terminal INPUT of the first shift register unit RS1 is configured to receive a start signal stv0.

The signal output terminal OUTPUT of the i-th shift register unit is connected to the signal input terminal INPUT of the (i+1)-th shift register unit (i is an integer, 1≤i≤n−1). For example, the signal output terminal OUTPUT of the shift register unit RS1 is connected to the signal input terminal INPUT of the shift register unit RS2, and the signal output terminal OUTPUT of the shift register unit RSn-1 is connected to the signal input terminal INPUT of the shift register unit RSn.

The signal output terminal OUTPUT of the (i+1)-th shift register unit is connected to the reset signal terminal RESET of the i-th shift register unit. For example, the signal output terminal OUTPUT of the shift register unit RS2 is connected to the reset signal terminal RESET of the shift register unit RS1, and the signal output terminal OUTPUT of the shift register unit RSn is connected to the reset signal terminal RESET of the shift register unit RSn-1.

The reset signal terminal RESET of the n-th shift register unit RSn is configured to receive the start signal stv0.

In the example of FIG. 13, the first shift register unit RS1 does not comprise an initialization circuit 60, and thus does not have the initialization signal terminal STV. The remaining shift register units RS2, . . . , RSn-1 and RSn each comprise an initialization circuit 60, and thus have an initialization signal terminal STV That is, the shift register unit RS1 may take the form of the shift register unit as shown in FIG. 5 or 8, and the remaining shift register units RS2, . . . , RSn-1 and RSn may take the form of the shift register unit as shown in FIG. 9 or 10. When the start signal stv0 is at a high level, the shift register unit RS1 enters the first phase P1, and the shift register units RS2, . . . , RSn-1, and RSn enter the initialization phase P0.

Figure 14:
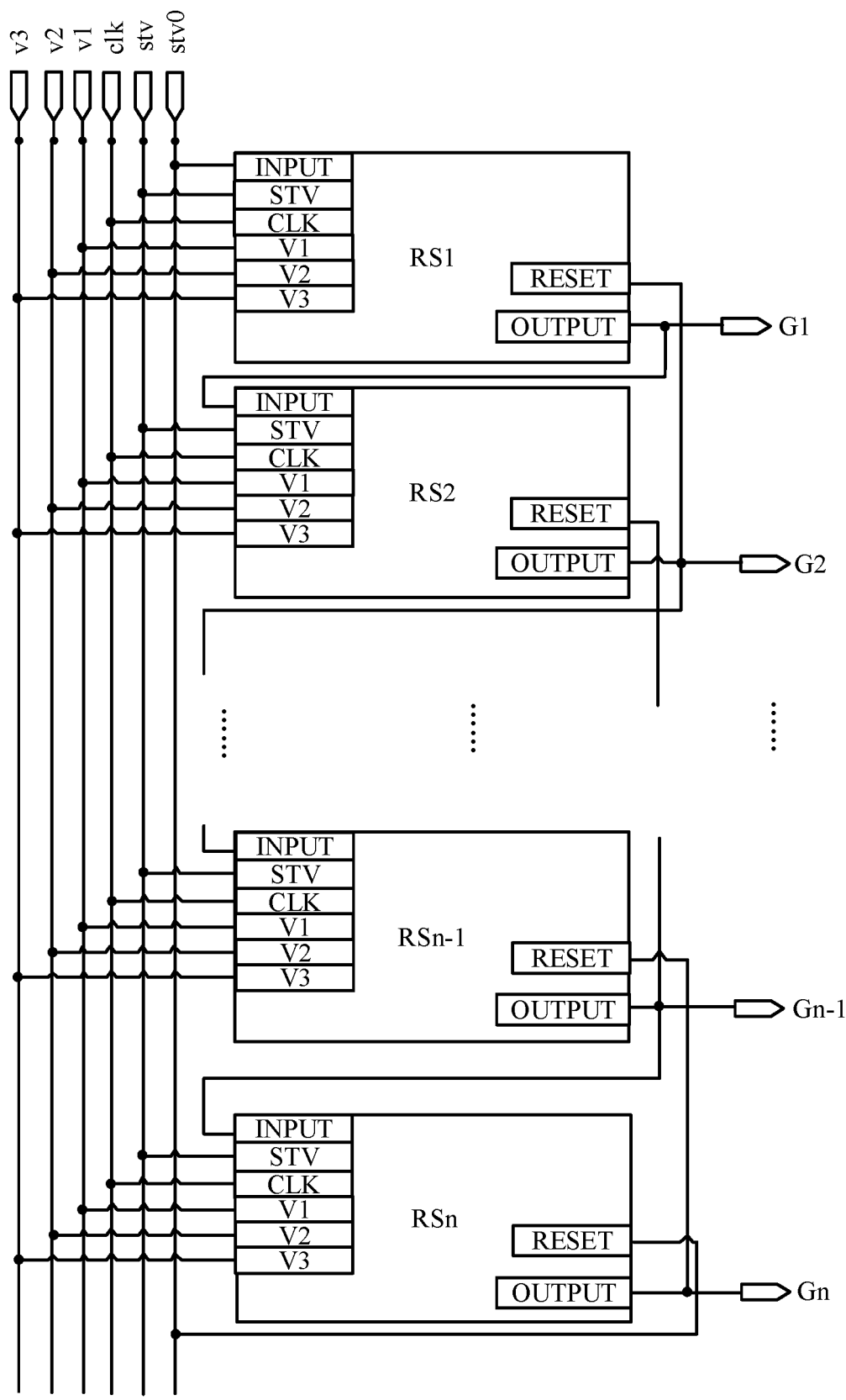
FIG. 14 is a schematic block diagram of a gate driving circuit in accordance with another exemplary embodiment.

FIG. 14 is a schematic block diagram of a gate driving circuit in accordance with another exemplary embodiment. In this example, each of the shift register units RS1, RS2, . . . , RSn-1, and RSn comprises an initialization circuit 60, and thus has an initialization signal terminal STV As shown in FIG. 14, the signal input terminal INPUT of the first shift register unit RS1 is configured to receive the start signal stv0, and the initialization signal terminals STV of the shift register units RS1, RS2, . . . , RSn-1 and RSn are configured to receive the same initialization signal sty. When the initialization signal sty is at a high level, all of the shift register units RS2, . . . , RSn-1 and RSn enter the initialization phase P0. Then, the start signal stv0 transitions to a high level, and the shift register unit RS1 enters the first phase P1.

It will be understood that while the shift register unit embodiments and the gate driving circuit embodiments are described above with examples where the transistors are N-type transistors, in other exemplary embodiments the transistors in the shift register unit may be P-Type transistors. In the case of the P-type transistors, the timing diagrams shown in FIGS. 11 and 12 are adapted according to the switching logic of the P-type transistors. For the sake of brevity, the operation of the shift register unit composed of P-type transistors is not described in detail herein.

The gate driving circuit embodiments have the same advantages as those of the shift register unit embodiments described above and will not be described again herein.

Figure 15:
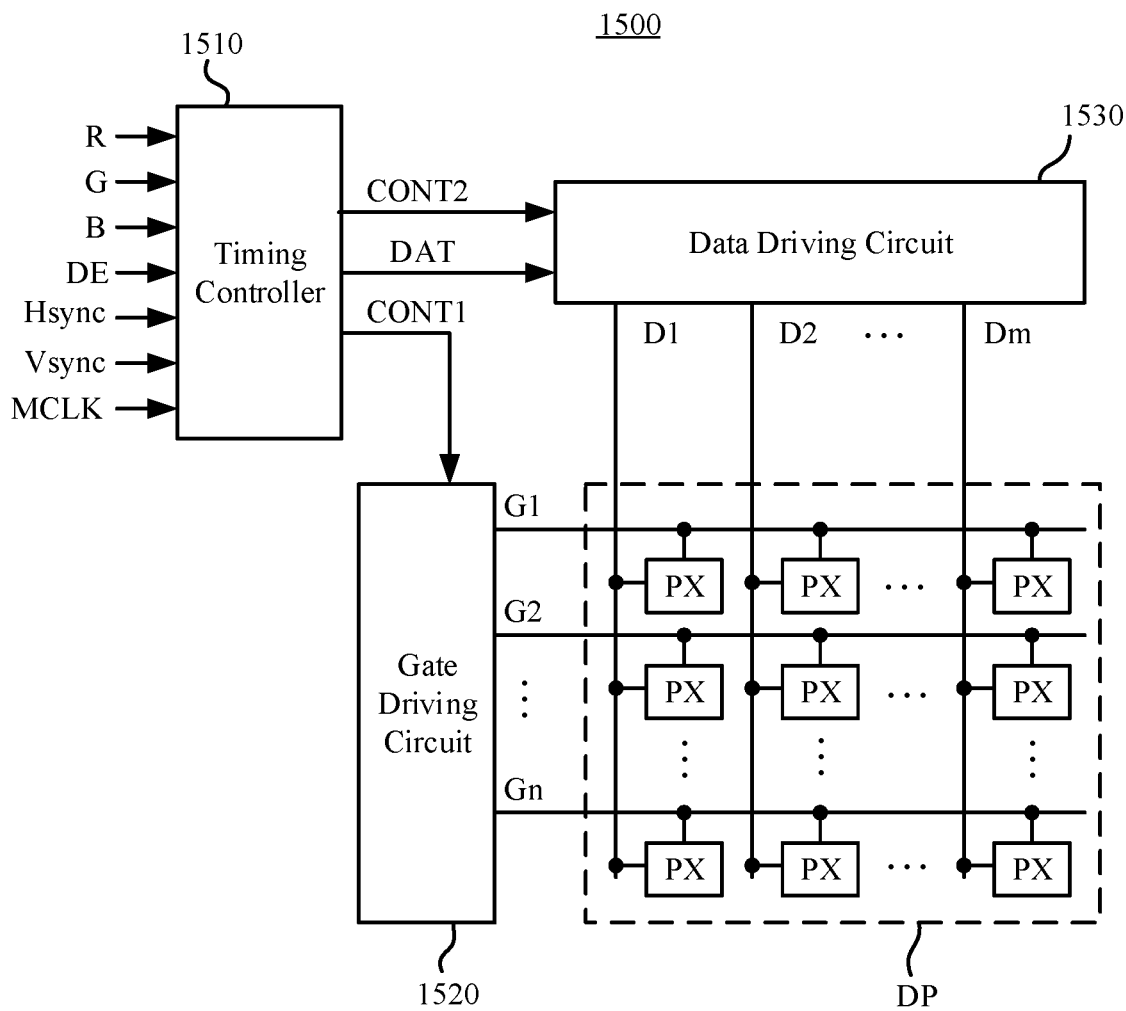
FIG. 15 is a schematic block diagram of a display device in accordance with an exemplary embodiment.

FIG. 15 is a schematic block diagram of a display device 1500 in accordance with an exemplary embodiment. Referring to FIG. 15, the display device 1500 comprises a timing controller 1510, a gate driving circuit 1520, a data driving circuit 1530, and a display panel DP.

The timing controller 1510 receives synchronization signals and video signals R, and B from a system interface. The synchronization signals may comprise a horizontal synchronization signal Hsync, a vertical synchronization signal Vsync, a main clock signal MCLK, and a data enable signal DE. The video signals R, and B contain luminance information of each of a plurality of pixels PX. The timing controller 1510 generates a first driving control signal CONT1, a second driving control signal CONT2, and image data signals DAT according to the video signals R, and B, the horizontal synchronization signal Hsync, the vertical synchronization signal Vsync, the data enable signal DE, and the main clock signal MCLK. The first driving control signal CONT1 may comprise a start signal stv0 (and potentially an initialization signal sty) and a clock signal clk. The timing controller 1510 divides the video signals R, and B into units of frames according to the vertical synchronization signal Vsync, and divides the video signals R, and B into units of data lines according to the horizontal synchronization signal Hsync to generate the image data signals DAT. The timing controller 1510 transfers the image data signals DAT and the second driving control signal CONT2 to the data driving circuit 1530.

The display panel DP comprises the pixels PX arranged substantially in a matrix form. In the display panel DP, a plurality of substantially parallel gate lines G1 to Gn extend in a row direction, and a plurality of substantially parallel data lines D1 to Dm extend in a column direction. The gate lines G1 to Gn and the data lines D1 to Dm are coupled to the pixels PX. The display panel DP may be a liquid crystal display panel, an organic light emitting diode display panel, or any other suitable type of display panel.

The gate driving circuit 1520 is coupled to the gate lines G1 to Gn and generates a plurality of corresponding scan signals according to the first driving control signal CONT1. The gate driving circuit 1520 sequentially applies these scan signals to the gate lines G1 to Gn. The gate driving circuit 1520 may take the form of the gate driving circuit embodiments described above. In some exemplary embodiments, the gate driving circuit 1520 is integrated into the display panel DP as gate-driver-on-array (GOA) circuit. Alternatively, the gate driving circuit 1520 may be connected to the display panel DP through a Tape Carrier Package (TCP).

The data driving circuit 1530 is coupled to the data lines D1 to Dm. In response to the second driving control signal CONT2, the data driving circuit 1530 converts the image data signals DAT into analog data voltages and applies the converted analog data voltages to the data lines D1 to Dm, respectively. In some exemplary embodiments, the data driving circuit 1530 may comprise a shift register, a latch, a digital-to-analog converter, and a buffer. The shift register may output a latch pulse to the latch. The latch can temporarily store the image data signals DAT and can output the image data signals DAT to the digital-to-analog converter. The digital-to-analog converter converts the image data signals DAT into the analog data voltages, and outputs the converted analog data voltages to the buffer. The buffer outputs the analog data voltages to the data lines D1 to Dm.

Examples of the display device 1500 comprise any product or component having a display function such as a display, a television, a digital photo frame, a mobile phone, or a tablet. The display device embodiments have the same advantages as those of the above-described shift register unit embodiments and will not be described again here.

The foregoing is only exemplary embodiments of the present disclosure, but the scope of the present disclosure is not limited thereto. Any variations or substitutions readily occurred to those skilled in the art are intended to be encompassed within the scope of the present disclosure. Therefore, the scope of the disclosure should be defined by the appended claims.

What is claimed is:

1. A shift register unit, comprising:
   a reset signal terminal, a first voltage terminal, a second voltage terminal, a third voltage terminal, a clock signal terminal, a signal input terminal, and a signal output terminal;
   a first node control circuit configured to transfer a reset signal at the reset signal terminal to a first node in response to the reset signal at the reset signal terminal being active;
   a second node control circuit configured to transfer an inactive voltage at the first voltage terminal to the first node in response to a potential at a second node being active;
   an energy-storing circuit configured to store a voltage across the first node and the first voltage terminal;
   a first voltage pull circuit configured to transfer the inactive voltage at the first voltage terminal to the second node and the signal output terminal in response to a first supply voltage signal at the second voltage terminal and a potential at the first node being active;
   a second voltage pull circuit configured to transfer the inactive voltage at the first voltage terminal to the second node and the signal output terminal in response to a second supply voltage signal at the third voltage terminal and the potential at the first node being active; and
   an output circuit configured to transfer a clock signal at the clock signal terminal to the signal output terminal in response to the potential at the second node being active.

2. The shift register unit of claim 1, further comprising:
   an initialization signal terminal; and
   an initialization circuit configured to transfer an initialization signal at the initialization signal terminal to the first node in response to the initialization signal at the initialization signal terminal being active.

3. The shift register unit of claim 1, further comprising:
a first input circuit configured to transfer an input signal at the signal input terminal to the second node in response to the input signal at the signal input terminal being active; and
a second input circuit configured to transfer the inactive voltage at the first voltage terminal to the second node in response to the reset signal at the reset signal terminal being active.

4. The shift register unit of claim 1, further comprising:
a reset circuit configured to transfer the inactive voltage at the first voltage terminal to the signal output terminal in response to the reset signal at the reset signal terminal being active.

5. The shift register unit of claim 1, wherein the first node control circuit comprises a first transistor comprising a gate connected to the reset signal terminal, a first electrode connected to the reset signal terminal, and a second electrode connected to the first node.

6. The shift register unit of claim 1, wherein the second node control circuit comprises a second transistor comprising a gate connected to the second node, a first electrode connected to the first node, and a second electrode connected to the first voltage terminal.

7. The shift register unit of claim 1, wherein the energy-storing circuit comprises a first capacitor comprising a first terminal connected to the first node and a second terminal connected to the first voltage terminal.

8. The shift register unit of claim 1, wherein the first voltage pull circuit comprises:
a third transistor comprising a gate connected to the second voltage terminal, a first electrode connected to the third node, and a second electrode connected to the first node;
a fourth transistor comprising a gate connected to the third node, a first electrode connected to the second node, and a second electrode connected to the first voltage terminal; and
a fifth transistor comprising a gate connected to the third node, a first electrode connected to the signal output terminal, and a second electrode connected to the first voltage terminal.

9. The shift register unit of claim 1, wherein the second voltage pull circuit comprises:
a sixth transistor comprising a gate connected to the third voltage terminal, a first electrode connected to the first node, and a second electrode connected to the fourth node;
a seventh transistor comprising a gate connected to the fourth node, a first electrode connected to the second node, and a second electrode connected to the first voltage terminal; and
an eighth transistor comprising a gate connected to the fourth node, a first electrode connected to the signal output terminal, and a second electrode connected to the first voltage terminal.

10. The shift register unit of claim 1, wherein the output circuit comprises:
a second capacitor comprising a first terminal connected to the second node and a second terminal connected to the signal output terminal; and
a thirteenth transistor comprising a gate connected to the second node, a first electrode connected to the clock signal terminal, and a second electrode connected to the signal output terminal.

11. The shift register unit of claim 2, wherein the initialization circuit comprises a ninth transistor comprising a gate connected to the initialization signal terminal, a first electrode connected to the initialization signal terminal, and a second electrode connected to the first node.

12. The shift register unit of claim 2, wherein the initialization circuit comprises:
a ninth transistor comprising a gate connected to the initialization signal terminal, a first electrode connected to the initialization signal terminal, and a second electrode connected to the first node; and
a tenth transistor comprising a gate connected to the initialization signal terminal, a first electrode connected to the second node, and a second electrode connected to the first voltage terminal.

13. The shift register unit of claim 3,
wherein the first input circuit comprises an eleventh transistor comprising a gate connected to the signal input terminal, a first electrode connected to the signal input terminal, and a second electrode connected to the second node, and
wherein the second input circuit comprises a twelfth transistor comprising a gate connected to the reset signal terminal, a first electrode connected to the second node, and a second electrode connected to the first voltage terminal.

14. The shift register unit of claim 4, wherein the reset circuit comprises a fourteenth transistor comprising a gate connected to the reset signal terminal, a first electrode connected to the signal output terminal, and a second electrode connected to the first voltage terminal.

15. A gate driving circuit comprising n shift register units of claim 1 that are cascaded, n being an integer greater than or equal to 2,
wherein the signal input terminal of a first one of the n shift register units is configured to receive a start signal,
wherein the signal output terminal of an i-th one of the n shift register units is connected to the signal input terminal of an (i+1)-th one of the n shift register units, i being an integer, 1≤i≤n−1,
wherein the signal output terminal of the (i+1)-th one of the n shift register units is connected to the reset signal terminal of the i-th one of the n shift register units, and
wherein the reset signal terminal of an n-th one of the n shift register units is configured to receive the start signal.

16. A display device comprising the gate driving circuit of claim 15.

17. A method of driving a shift register unit, wherein the shift register unit comprises: a reset signal terminal, a first voltage terminal, a second voltage terminal, a third voltage terminal, a clock signal terminal, a signal input terminal, and a signal output terminal; a first node control circuit configured to transfer a reset signal at the reset signal terminal to a first node in response to the reset signal at the reset signal terminal being active; a second node control circuit configured to transfer an inactive voltage at the first voltage terminal to the first node in response to a potential at a second node being active; an energy-storing circuit configured to store a voltage across the first node and the first voltage terminal; a first voltage pull circuit configured to transfer the inactive voltage at the first voltage terminal to the second node and the signal output terminal in response to a first supply voltage signal at the second voltage terminal and a potential at the first node being active; a second voltage pull circuit configured to transfer the inactive voltage at the first voltage terminal to the second node and the signal output terminal in response to a second supply voltage signal at the third voltage terminal and the potential at the first node being active; and an output circuit configured to transfer a clock signal at the clock signal terminal to the signal output terminal in response to the potential at the second node being active, the method comprising:
responsive to the potential at the second node being active, transferring by the output circuit the clock signal at the clock signal terminal to the signal output terminal, and transferring by the second node control circuit the inactive voltage at the first voltage terminal to the first node;
responsive to the reset signal at the reset signal terminal being active, transferring by the first node control circuit the reset signal at the reset signal terminal to the first node; and
responsive to the potential at the first node being active, transferring the inactive voltage at the first voltage terminal to the second node and the signal output terminal.

18. The method of claim 17, wherein the first supply voltage signal at the second voltage terminal is active, and wherein the transferring the inactive voltage at the first voltage terminal to the second node and the signal output terminal comprises:
responsive to the first supply voltage signal at the second voltage terminal and the potential at the first node being active, transferring by the first voltage pull circuit the inactive voltage at the first voltage terminal to the second node and the signal output terminal.

19. The method of claim 17, wherein the second supply voltage signal at the third voltage terminal is active, and wherein the transferring the inactive voltage at the first voltage terminal to the second node and the signal output terminal comprises:
responsive to the second supply voltage signal at the third voltage terminal and the potential at the first node being active, transferring by the second voltage pull circuit the inactive voltage at the first voltage terminal to the second node and the signal output terminal.

20. The method of claim 17, wherein the shift register unit further comprises an initialization signal terminal and an initialization circuit configured to transfer an initialization signal at the initialization signal terminal to the first node in response to the initialization signal at the initialization signal terminal being active, the method further comprising:
responsive to the initialization signal at the initialization signal terminal being active, transferring by the initialization circuit the initialization signal at the initialization signal terminal to the first node.

\* \* \* \* \*